(12) United States Patent
Tschirhart

(10) Patent No.: US 9,812,979 B1
(45) Date of Patent: Nov. 7, 2017

(54) ESTIMATION OF TRANSFORMER LEAKAGE INDUCTANCE AND ASSOCIATED DELAY IN VOLTAGE CONVERTERS

(71) Applicant: Infineon Technologies Austria AG, Villach (AT)

(72) Inventor: Darryl Tschirhart, Torrance, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/396,006

(22) Filed: Dec. 30, 2016

(51) Int. Cl.
*H02M 3/335* (2006.01)
*H02M 1/14* (2006.01)
*G01R 31/02* (2006.01)

(52) U.S. Cl.
CPC ...... *H02M 3/33592* (2013.01); *G01R 31/025* (2013.01); *G01R 31/027* (2013.01); *H02M 1/14* (2013.01); *H02M 3/33507* (2013.01); *H02M 3/33569* (2013.01)

(58) Field of Classification Search
CPC ...... H02M 1/14; H02M 1/15; H02M 3/33507; H02M 3/33561; H02M 3/33569; H02M 3/33676; H02M 3/33592; G01R 31/02; G01R 31/25; G01R 31/27
See application file for complete search history.

(56) References Cited

U.S. PATENT DOCUMENTS

| 7,495,875 | B2* | 2/2009 | Lin | H02M 1/32 361/89 |
| 8,000,119 | B2* | 8/2011 | Choi | H02M 1/44 363/131 |
| 8,421,430 | B2* | 4/2013 | Sasaki | H02M 3/157 323/283 |
| 2005/0024897 | A1* | 2/2005 | Yang | H02M 1/38 363/21.06 |

(Continued)

OTHER PUBLICATIONS

Chen, Bo-Yuan et al., "Switching Control Technique of Phase-Shift-Controlled Full-Bridge Converter to Improve Efficiency Under Light-Load and Standby Conditions Without Additional Auxiliary Components", IEEE Transactions on Power Electronics, vol. 25, No. 4, Apr. 2010, pp. 1001-1012.

(Continued)

*Primary Examiner* — Matthew Nguyen
(74) *Attorney, Agent, or Firm* — Murphy, Bilak & Homiller, PLLC

(57) ABSTRACT

A time delay through a voltage converter, including a transformer therein, must be known or estimated in order to optimally control the voltage converter. For example, power switches that control the input power to the voltage converter must use this time delay in order to, e.g., achieve zero-voltage switching (ZVS) with minimal dead-time. The time delays are typically considered as constants, and the power switch control is optimized for a limited operational range that corresponds to such constant time delays. Herein, variable time delays are determined based upon varying load conditions of the voltage converter. By more accurately determining the time delay for a given load condition and (Continued)

basing the voltage converter control on such accurate (load-dependent) time delays, the voltage converter may be more optimally controlled and achieve higher efficiency.

22 Claims, 7 Drawing Sheets

(56) References Cited

U.S. PATENT DOCUMENTS

2014/0252981 A1* 9/2014 Xie .................. H02M 3/33507
            315/291

OTHER PUBLICATIONS

Sabaté, J.A. et al., "Design Considerations for High-Voltage High-Power Full-Bridge Zero-Voltage-Switched PWM Converter", Fifth Annual Applied Power Electronics Conference and Exposition, APEC '90, 1990, pp. 275-284.

Tschirhart, Darryl et al., "Transformer Flux Estimation and Limiting in Isolated DC-DC Voltage Converters", U.S. Appl. No. 15/235,372, filed Aug. 12, 2016.

Yousefzadeh, Vahid et al., "Sensorless Optimization of Dead Times in DC-DC Converters With Synchronous Rectifiers", Twentieth Annual IEEE Applied Power Electronics Conference and Exposition, APEC 2005, pp. 911-917.

Yousefzadeh, Vahid et al., "Sensorless Optimization of Dead Times in DC-DC Converters With Synchronous Rectifiers", IEEE Transactions on Power Electronics, vol. 21, No. 4, Jul. 2006, pp. 994-1002.

* cited by examiner

ESTIMATION OF TRANSFORMER LEAKAGE INDUCTANCE AND ASSOCIATED DELAY IN VOLTAGE CONVERTERS

TECHNICAL FIELD

The present application relates to voltage converters that include a transformer and, in particular, relates to techniques for estimating the leakage inductance of the transformer and the associated load-dependent delays through the voltage converter.

BACKGROUND

Direct-current (DC) to DC voltage converters are used in numerous applications to transfer power from an input DC voltage and current to an output DC voltage and current. In a typical "step-down" configuration, a voltage converter will input power from a high voltage, low current source, and output low voltage, high current power to a load of the voltage converter. In an alternate configuration, a step-up voltage converter provides, relative to its input power source, an increased voltage and decreased current to the load. Such power conversions are accomplished by generating an alternating current (AC) on the primary side of the voltage converter, passing the AC power through a transformer that steps the voltage up or down, and then rectifying the resultant AC power on the secondary side of the transformer. The rectified (DC) power is then provided to a load of the voltage converter.

A delay is associated with the transfer of power through the transformer, i.e., a voltage pulse input to a primary winding of the transformer produces a corresponding voltage pulse on a secondary winding only after some propagation delay through the transformer. The control of the voltage converter must take this delay into account, e.g., to ensure adequate "dead-time" is provided to power switches that generate the AC power on the primary side of the transformer, to control synchronous rectification switches on the secondary side of the transformer, and to track magnetic flux to prevent transformer saturation. Typically, a fixed (constant) delay is presumed, which leads to worst-case values being chosen for timing-related control parameters such as dead-time. In practice, the propagation delay through a transformer varies, and the setting of control parameters based upon a presumed constant propagation delay leads to sub-optimal performance through at least some of the operating range for the voltage converter.

Accordingly, there is a need for improved techniques for estimating the propagation delay through a transformer within a voltage converter, including techniques that account for the variation of such delay under different load conditions of the voltage converter. Furthermore, techniques for using such a load-variant delay to achieve more efficient operation of the voltage converter are needed.

SUMMARY

According to an embodiment of a voltage converter, the voltage converter comprises a power stage that includes two or more power switches, and a controller. The controller is operable to determine a load-dependent timing delay of the voltage converter, e.g., as may be caused by a modelled leakage inductance of a transformer within the voltage converter. The controller determines this time delay by measuring, for each of at least two load conditions, an output current and a corresponding time delay. The load-dependent delay is then determined based upon the at least two output currents and their corresponding time delays. In a typical embodiment, the leakage inductance for a transformer within the voltage converter is determined based upon the at least two output currents and their corresponding time delays. Once an estimate of the leakage inductance is known, subsequent load-dependent delays may be determined from the leakage inductance and a load current (e.g., as sensed or measured).

According to an embodiment of a method within a voltage converter, an output current and a corresponding time delay are determined for each of at least two load conditions. A load-dependent delay of the voltage converter is then determined based upon the at least two output currents and their corresponding delays. In a typical embodiment, a leakage inductance of a transformer within the voltage converter is determined based upon the output current and corresponding time delays for the at least two load conditions. Once the leakage inductance is available, the load-dependent delay may be subsequently determined based upon the leakage inductance and a given load current (e.g., as sensed or measured).

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description that follows.

DETAILED DESCRIPTION

The embodiments described herein provide techniques for determining a load-dependent delay of a voltage converter, based upon output currents and propagation delays determined under at least two different load conditions. The overall propagation delay may be modelled using a constant delay, which is largely load-independent, and a load-dependent delay. The load-dependent delay may be characterized using a modelled leakage inductance of a transformer within the voltage converter. In preferred embodiments, this leakage inductance is estimated based upon the output currents and propagation delays measured under at least two different load conditions, together with other circuit parameters. Once the leakage inductance is known (estimated), the load-dependent delay may be determined for any given load condition based upon the given load condition (e.g., current measurement) and the estimated leakage inductance. The overall propagation delay, i.e., the combination of the load-dependent and constant delays, of the voltage converter may then be used to optimize parameters, such as dead-time, used in the control of the voltage converter. This, in turn, will lead to improved efficiency, improved safety, and/or improved longevity of the voltage converter.

The invention is described below primarily in the context of a full-bridge voltage converter, but it should be recognized that the described techniques may be readily extrapolated to other voltage converters having load-dependent delays, such as half-bridge voltage converters, for example. Many of the embodiments are directed to techniques for estimating a leakage inductance of a transformer and subsequently using that leakage inductance to determine a load-dependent delay. The techniques of these embodiments are similarly applicable to other voltage converters having a transformer that may be modelled using a leakage inductance. The described embodiments provide particular examples for purposes of explanation, and are not meant to be limiting. Features and aspects from the example embodiments may be combined or re-arranged, except where the context does not allow this.

Full-Bridge Voltage Converter Embodiment

Figure 1:
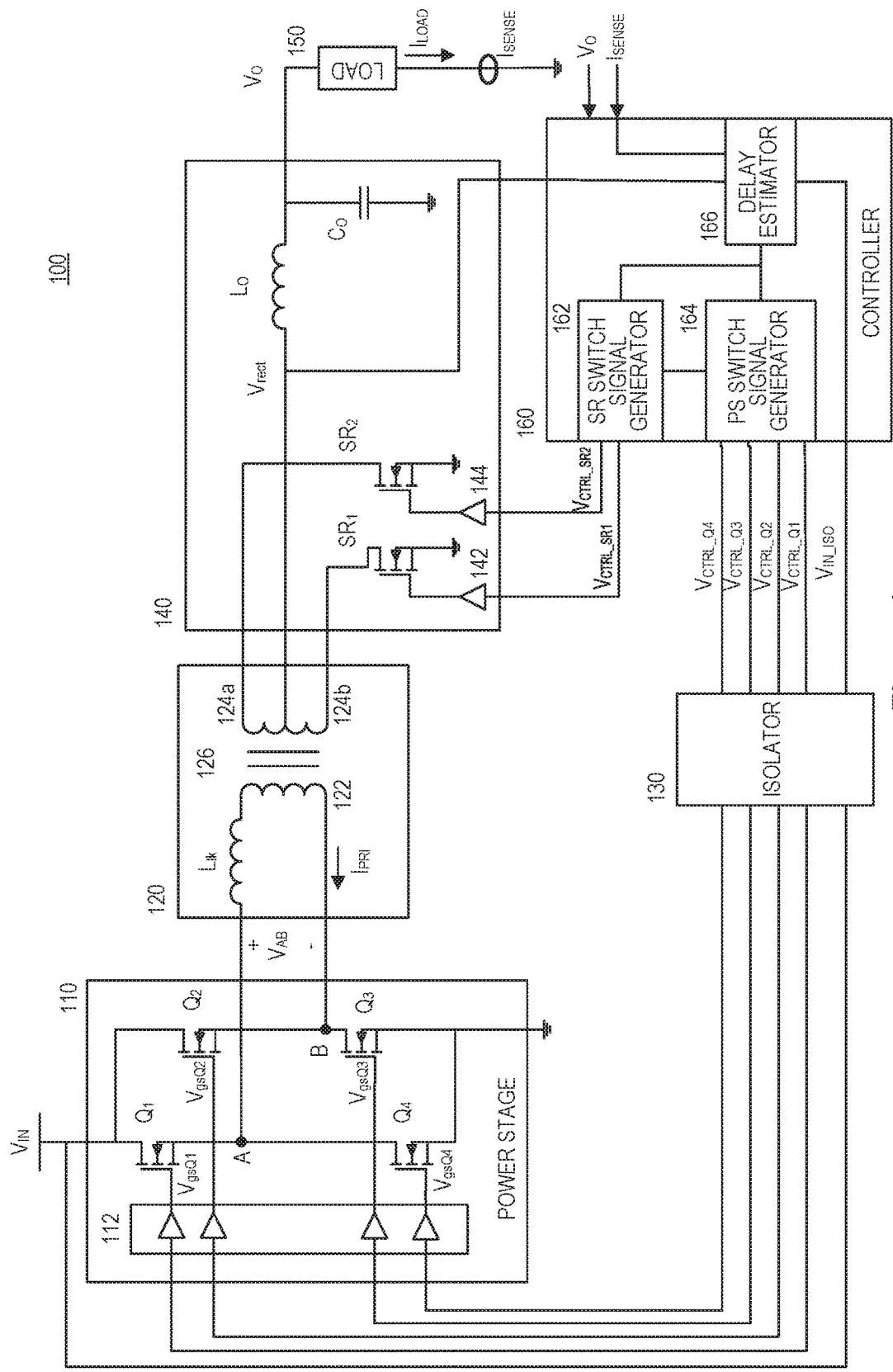
FIG. 1 illustrates a circuit diagram of a full-bridge voltage converter that estimates a load-dependent delay through its transformer.

FIG. 1 illustrates a DC-DC voltage converter 100 within which a load-dependent delay is determined and subsequently used for optimizing the control of the voltage converter 100. The voltage converter 100 includes a power stage 110, a transformer 120, an isolator 130, a conditioning circuit 140 and a controller 160. An input power source $V_{IN}$ provides power to the voltage converter 100, and the voltage converter 100 supplies output power to a load 150.

The input power source $V_{IN}$ is provided to the power stage 110, which couples it to the transformer 120 using power switches. The illustrated power stage 110 includes four power switches $Q_1$, $Q_2$, $Q_3$, $Q_4$, each of which has an associated driver within a driver stage 112. The power switches $Q_1$, $Q_2$, $Q_3$, $Q_4$ may be integrated on the same semiconductor die, may each be provided on separate dies, or may otherwise be spread across a plurality of semiconductor dies. The drivers within the driver stage 112 may be integrated on the same semiconductor die, may each be provided on separate dies, or may otherwise be spread across a plurality of semiconductor dies. Each driver of the driver stage 112 may be integrated on the same semiconductor die as its corresponding power switch, may be located on a different die than its corresponding power switch, or may otherwise be spread across a plurality of dies. The power switches $Q_1$, $Q_2$, $Q_3$, $Q_4$ are oriented in a full-bridge configuration. During a fully active interval within a positive half-cycle of the voltage converter 100, switches $Q_1$ and $Q_3$ are conducting, thereby producing a positive voltage across $V_{AB}$, which is provided to the transformer 120. During a fully active interval within a negative half-cycle of the voltage converter 100, switches $Q_2$ and $Q_4$ are conducting, thereby providing a negative voltage to the transformer 120 across its input $V_{AB}$. When the voltage converter 100 is operated using non-phase-shifted pulse width modulation (PWM), the active periods are separated by dead-time periods in which no power switches $Q_1$, $Q_2$, $Q_3$, $Q_4$, are conducting. When operating the voltage converter 100 using phase-shift modulation (PSM), there may be partially active and "dead time" intervals. The timings of these intervals are preferably controlled to achieve zero voltage switching (ZVS), such that the power switches $Q_1$, $Q_2$, $Q_3$, $Q_4$ are switched when the voltage across each of them is zero (or substantially zero). These timings are explained in further detail below in conjunction with FIG. 3.

The power switches $Q_1$, $Q_2$, $Q_3$, $Q_4$ are illustrated in FIG. 1 as enhancement-mode metal-oxide semiconductor field-effect transistors (MOSFETs), but other switch types may be used. For example, junction field-effect transistors (JFETs), bipolar junction transistors (BJTs), insulated gate bipolar transistors (IGBTs), high electron mobility transistors (HEMTs), or other types of power transistors may be preferred in some applications. Many of the techniques described herein are particularly beneficial to voltage converters that use MOSFETs, which are characterized as having an antiparallel body diode. As is well-known, current may flow through a MOSFET's body diode, in a backwards direction relative to normal current flow through the MOSFET, when the MOSFET is turned off such that it is not conducting in a forward direction. This conduction through the body diode has an associated power loss, which should be avoided or at least minimized. Even when there is no significant forward current conduction needed through the MOSFET, it is often desirable to leave the MOSFET turned on in order to avoid the diode conduction loss.

The transformer 120 includes a primary winding 122 having N1 turns, secondary windings 124a, 124b having N2 turns each, and a core 126. The transformer 120 of FIG. 1 also includes a leakage inductance $L_{LK}$, which is not typically a separate component, but which models stray inductance that is not included in the windings 122, 124a, 124b. For the techniques described herein, the leakage inductance $L_{LK}$ is presumed to include the transformer's leakage inductance, as well as any other parasitic inductance or inductor components included in series with the primary winding 122. The secondary windings 124a, 124b are connected together at a center tap. A rectified voltage node $V_{rect}$ is coupled to this center tap. The turns ratio N=N1/N2 determines the ratio of the input voltage $V_{AB}$ of the transformer 120 to the rectified voltage $V_{rect}$. While the transformer 120 of FIG. 1 includes a center tap, it should be recognized that the techniques herein are also applicable to voltage converters that do not include a center-tapped transformer. For example and as is well-known in the art, full-wave rectification may be provided by SR switches or diodes coupled to the taps of a single (non-center-tapped) secondary winding of a transformer. The techniques herein may be readily extrapolated to a voltage converter using such a transformer.

The conditioning circuit 140 is configured to rectify the voltage output from the secondary windings 124a, 124b, and to filter the rectified voltage $V_{rect}$ before it is provided to the load 150. As shown in FIG. 1, rectification switches $SR_1$, $SR_2$ are controlled by the controller 160, via switch drivers 142, 144, to produce the rectified voltage $V_{rect}$ from the AC voltage induced across the secondary windings 124a, 124b. The rectified voltage $V_{rect}$ is provided to the controller 160 in order to, e.g., aid the controller 160 in this rectification. (The rectified voltage $V_{rect}$ may need to be attenuated, e.g., using a resistor divider, before being input to the controller 160. For ease of illustration, this is not shown.) Other rectification circuits or techniques, e.g., using diodes rather than rectification switches, may be used instead. In general, such diode-based rectification is not preferred due to the power loss associated with the diodes, as compared with the active rectification using rectification switches $SR_1$, $SR_2$ as shown in FIG. 1. The conditioning circuit 140 also includes an output inductor $L_O$ and capacitor $C_O$, which form a low-pass LC filter. The LC filter serves to smooth the voltage $V_O$ provided to the load 150.

The controller 160 is responsible for controlling the voltage converter 100 in order to supply the necessary power (voltage $V_O$ and current $I_{LOAD}$) to the load 150. The controller 160 includes a synchronous rectification (SR) switch control signal generator 162, a power stage (PS) switch control signal generator 164, and a delay estimator 166. The SR switch control signal generator 162 generates signals that control the rectification switches $SR_1$, $SR_2$ in order to generate the rectified voltage $V_{rect}$. This signal generation is typically based upon signals from the PS switch control signal generator 164 together with known, fixed delays for latencies in the voltage converter 100. The use of power switches, such as the rectification switches $SR_1$, $SR_2$, to rectify a voltage is, generally, well-known in the art and will not be described further, except as it relates to modifications associated with the delay estimator 166. More particularly and as will be described in detail further below, a load-dependent delay provided by the delay estimator 166 may be used, e.g., to modify baseline SR control signals before those signals are output from the SR switch control signal generator 162.

The PS switch control signal generator 164 produces signals $V_{CTRL\_Q1}$, $V_{CTRL\_Q2}$, $V_{CTRL\_Q3}$, $V_{CTRL\_Q4}$ that control the switches $Q_1$, $Q_2$, $Q_3$, $Q_4$ of the power stage 110, in order to ensure adequate power is supplied to the load 150. This signal generation is based upon the output voltage $V_O$ and/or the load current $I_{LOAD}$. Conventional techniques are used to generate baseline power-switch control signals, based upon load requirements. For example, a proportional, integral and derivative (PID) controller might use the output voltage $V_O$ to adaptively determine duty cycles for the PWM signals $V_{CTRL\_Q1}$, $V_{CTRL\_Q2}$, $V_{CTRL\_Q3}$, $V_{CTRL\_Q4}$. Because such baseline techniques are well-known, they will not be described further herein. (The output voltage $V_O$ may need to be attenuated, e.g., using a resistor divider, before being input to the controller 160. For ease of illustration, this is not shown.) Instead, the following description focuses on the unique aspects of this invention, which are directed to techniques for estimating a load-dependent delay through the voltage converter 100. This delay may subsequently be used, e.g., to modify baseline PWM signals corresponding to $V_{CTRL\_Q1}$, $V_{CTRL\_Q2}$, $V_{CTRL\_Q3}$, $V_{CTRL\_Q4}$, before those signals are output from the PS switch control signal generator 164.

The delay estimator 166 estimates a timing delay, including constant and load-dependent components, and provides this timing delay to other circuits within the controller 160. This timing delay may be used to optimize the timings of generated signals within the controller 160. In a preferred embodiment, the delay estimator 166 estimates the leakage inductance $L_{LK}$. Once the leakage inductance $L_{LK}$ is estimated, it may subsequently be used to determine the load-dependent component of the time delay through the voltage converter 100, including the transformer 120. This time delay may then be used by, e.g., the SR switch control generator 162 and the PS switch control signal generator 164, in order to optimize the timing of their signal generation.

The controller 160 and its constituent parts may be implemented using a combination of analog hardware components (such as transistors, amplifiers, diodes, and resistors), and processor circuitry that includes primarily digital components. The processor circuitry may include one or more of a digital signal processor (DSP), a general-purpose processor, and an application-specific integrated circuit (ASIC). The controller 160 may also include memory, e.g., non-volatile memory such as flash, that includes instructions or data for use by the processor circuitry, and one or more timers. The memory may store values for the transformer turns ratio N, the estimated leakage inductance $L_{LK}$, etc. The controller 160 inputs sensor signals such as signals corresponding to $V_O$, $V_{rect}$, $I_{SENSE}$ and $V_{IN\_ISO}$, for use in implementing the techniques described below.

Determination of Leakage Inductance

The time delay through the voltage converter 100 is the delay from when the controller 160 sets a signal to enable one of the power switches $Q_1$, $Q_2$, $Q_3$, $Q_4$ until its effect is seen on the secondary side, e.g., at the rectified voltage node $V_{rect}$. This delay is given by:

$$\tau_{total} = \tau_{Llk} + \tau_{cct} \quad (1)$$

where $\tau_{Llk}$ is the load-dependent component of the delay, which may be modelled using:

$$\tau_{Llk} = \frac{2L_{lk}}{NV_{in}} I_o \quad (2)$$

where N is the turns ratio of the transformer 120,
$V_{in}$ is an input voltage to the voltage converter, and
$I_O$ is an output current of the voltage converter.

The load-dependent delay $\tau_{Llk}$ is caused by the leakage inductance $L_{LK}$. The circuit delay $\tau_{cct}$ represents the delay of the other parts of the circuit, and is typically not dependent on the load. The circuit delay $\tau_{cct}$ for the voltage converter 100 of FIG. 1 includes the delays through the isolator 130, the driver circuit 112, and the switching time of the power switches $Q_1$, $Q_2$, $Q_3$, $Q_4$.

Figure 2:
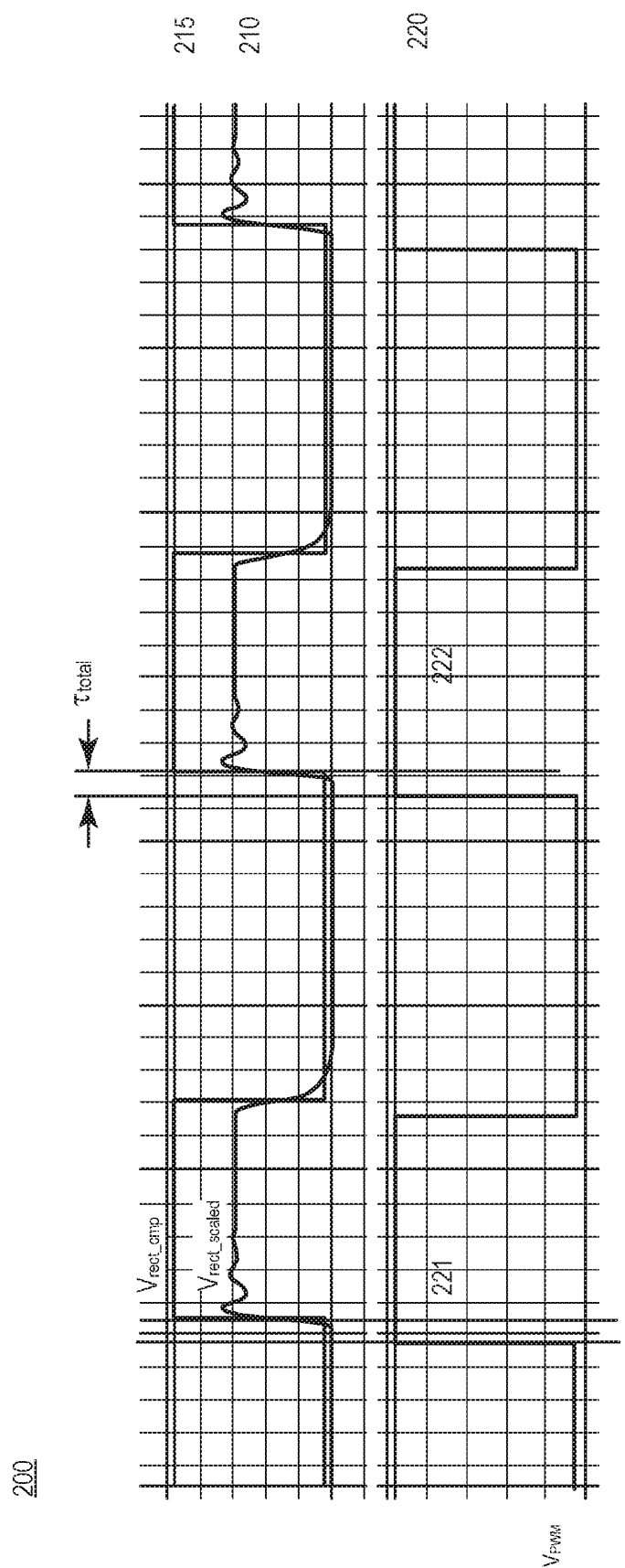
FIG. 2 illustrates waveforms that show propagation delays through the voltage converter of FIG. 1.

FIG. 2 shows waveforms 200 corresponding to signals within a voltage converter, in order to illustrate a delay $\tau_{total}$ as discussed above in relation to equation (1). These waveforms 200 represent switch control signals and measured rectified voltages for a full-bridge voltage converter such as that illustrated in FIG. 1. The control waveform 220 shows a pulse-width modulated (PWM) signal $V_{PWM}$, as generated within the controller 160 of the voltage converter 100. The switch control signals $V_{CTRL\_Q1}$, $V_{CTRL\_Q2}$, $V_{CTRL\_Q3}$, $V_{CTRL\_Q4}$ are derived from the PWM signal $V_{PWM}$. For example, the first pulse 221 of the $V_{PWM}$ control waveform 220 corresponds to the switch control signals $V_{CTRL\_Q1}$ and $V_{CTRL\_Q3}$ that are output from the PS switch control generator 164, the second pulse 222 of the $V_{PWM}$ control waveform 220 corresponds to the switch control signals $V_{CTRL\_Q2}$ and $V_{CTRL\_Q4}$, and so on. The switch control signals $V_{CTRL\_Q1}$, $V_{CTRL\_Q2}$, $V_{CTRL\_Q3}$, $V_{CTRL\_Q4}$ incur delays as they propagate through the isolator 130, the driver stage 112, and the power switches $Q_1$, $Q_2$, $Q_3$ $Q_4$. In response to the power switches $Q_1$ and $Q_3$, or $Q_2$ and $Q_4$ being turned on, a voltage pulse having a magnitude of $V_{in}$ is produced across the voltage input $V_{AB}$ to the transformer 120 and, after some delay, induces a voltage pulse at the rectified voltage $V_{rect}$. A scaled version of $V_{rect}$ is illustrated in the waveform 210 and is provided to the controller 160. A comparator (not shown for ease of illustration) within the controller 160 compares the scaled rectified voltage $V_{rect\_scaled}$ against a threshold value to produce a binary voltage $V_{rect\_cmp}$, which provides an indication of when the rectified voltage $V_{rect}$ is active, as shown in the waveform 215. The time difference $\tau_{total}$ between the rising edge of a pulse on $V_{PWM}$ and a rising edge of a pulse of the comparator output $V_{rect\_cmp}$, is measured by the controller 160 using, e.g., a timer therein. This time difference $\tau_{total}$ is then provided to the delay estimator 166 for use in determining the leakage inductance $L_{LK}$.

The leakage inductance given by equation (2) may be determined from measurements made at two load conditions. Assume $\tau_{total1}$ is measured for a current condition $I_{O1}$ and $\tau_{total2}$ is measured for a current condition $I_{O2}$. Presuming the circuit delay $\tau_{cct}$ is constant over load, then a time delay difference for these current conditions is given by:

$$\Delta\tau = \tau_{total1} - \tau_{total2} \quad (3)$$

$$\Delta\tau = (\tau_{Llk1} - \tau_{Llk2}) = \left(\frac{2L_{lk}}{NV_{in}}I_{o1} - \frac{2L_{lk}}{NV_{in}}I_{o2}\right). \quad (4)$$

Solving for the leakage inductance $L_{LK}$ and adding a compensation gain k and compensation offset $L_{off}$ leads to:

$$L_{lk} = \frac{\Delta\tau NV_{in}k}{2(I_{o1} - I_{o2})} + L_{off}. \quad (5)$$

The currents given by $I_{O1}$ and $I_{O2}$ correspond to the load current $I_{load}$ in the voltage converter 100 of FIG. 1 for each of a first and a second load condition. In a first sub-embodiment, the load current $I_{LOAD}$ is measured for multiple samples and averaged over one cycle of the voltage converter 100 in order to obtain the current $I_{O1}$ for the first load condition. This is repeated to obtain the current $I_{O2}$ for the second load condition. Such averaging removes, or at least mitigates, the effect of any ripple in the load current $I_{LOAD}$. In a second sub-embodiment, the current $I_{LOAD}$ is sampled at a mid-point of one cycle of the voltage converter 100 for each of the load conditions. The effect of any current ripple is minimized, but multiple current samples are not needed. In a third embodiment, the current $I_{LOAD}$ is sampled at a time instant within a cycle (or half-cycle) of the voltage converter 100, wherein the time instant corresponds closely to the instant when the time delay is measured. For example, the sampling time instant may be triggered by an edge of a signal controlling the power switches $Q_1$, $Q_2$, $Q_3$, $Q_4$, or by a pulse edge of the rectified voltage $V_{rect}$.

In order to solve equation (5), the two load conditions, as given by $I_{O1}$ and $I_{O2}$ cannot be the same. Calculation of an accurate estimation in equation (5) further requires that the difference between $I_{O1}$ and $I_{O2}$) be sufficiently large, in order to avoid excessive noise generation in the leakage inductance $L_{LK}$ estimation that is due to noise (e.g., thermal noise or quantization noise) in the measurements of the currents $I_{O1}$, $I_{O2}$ corresponding to the two load conditions. Preferably, the currents $I_{O1}$, $I_{O2}$ differ by a factor of 2 or more, but equation (5) will typically produce reasonable results for currents that differ by 10% of more.

The compensation gain k and offset $L_{off}$ terms are used to compensate for anomalies and errors that are not addressed by the other terms in equation (5). Of particular note, the transformer 120 will typically have some magnetizing inductance (not illustrated) that may not be adequately considered in a transformer model that neglects magnetizing inductance. The compensation gain k and offset $L_{off}$ terms account for the effects of such magnetizing inductance. These terms will typically be constants that are stored in a memory of the controller 160, and which are determined based on the transformer 120 characteristics.

In a preferred embodiment, the determination of the leakage inductance $L_{LK}$ is done during a calibration or characterization phase of the voltage converter 100, during which the load condition may be controlled. For example, the load may be fixed to draw a constant 6 A for a first load condition $I_{O1}$, 12.5 A for a second load condition $I_{O2}$, and 25 A for a third load condition $I_{O3}$. For each load condition, the voltage converter 100 may be run for several cycles, the time delay measured for each of these several cycles, and the time delays averaged to produce an averaged time delay for that load condition. The averaged time delays may then be used to calculate the leakage inductance $L_{LK}$ according to equation (5).

Simulation results for three different load conditions are shown in Table 1 for a negative half cycle of a voltage converter, and in Table 2 for a positive half cycle of a voltage converter. The simulated current and time delays are used for calculating leakage inductance $L_{LK}$ values for the positive and negative half cycles. These calculations use equation (5) and the values $V_{in}$=75V, N=2.5, $\tau_{off}$=3 ns, and $L_{off}$=0. The actual value of the leakage inductance in these simulations was 100 nH.

TABLE 1

Simulation results for leakage inductance $L_{LK}$ estimation for negative half cycle

| $I_O$ (A) | $\tau_{total}$ (ns) | $I_{O1}$ (A) | $I_{O2}$ (A) | $\Delta\tau_{total}$ (ns) | $L_{LK}$ (nH) |
|---|---|---|---|---|---|
| 6 | 62.97 | 25 | 12.5 | 13.01 | 97.6 |
| 12.5 | 67.91 | 12.5 | 6 | 7.94 | 114.5 |
| 25 | 77.93 | 25 | 6 | 17.95 | 88.6 |
| | | | | Average | 100.2 |

TABLE 2

Simulation results for leakage inductance $L_{LK}$ estimation for positive half cycle

| $I_O$ (A) | $\tau_{total}$ (ns) | $I_{O1}$ (A) | $I_{O2}$ (A) | $\Delta\tau_{total}$ (ns) | $L_{LK}$ (nH) |
|---|---|---|---|---|---|
| 6 | 63.05 | 25 | 12.5 | 12.9 | 96.7 |
| 12.5 | 67.91 | 12.5 | 6 | 7.85 | 113.3 |
| 25 | 77.81 | 25 | 6 | 17.75 | 87.6 |
| | | | | Average | 99.2 |

It is not necessary to determine the leakage inductance $L_{LK}$ during a calibration phase. In an alternative embodiment, the leakage inductance $L_{LK}$ may be determined during normal operation of the voltage converter 100. An initial leakage inductance $L_{LK}$ may be estimated based upon typical values for the transformer 120 within the voltage converter 100. The value for the leakage inductance $L_{LK}$ may be chosen conservatively to ensure adequate dead-time is achieved for the power switches $Q_1$, $Q_2$, $Q_3$, $Q_4$ under all load conditions. As the voltage converter 100 operates, the delay estimator 166 monitors the time delay and load current $I_{LOAD}$ for various load conditions. When the delay estimator 166 has time delays and load currents corresponding to two or more load conditions, it can determine the leakage inductance $L_{LK}$ according to equation (5).

In yet a further embodiment, the leakage inductance $L_{LK}$ may be initially determined during a calibration/characterization phase, as described in the preferred embodiment above, and subsequently adapted during normal operation. Also note that the leakage inductance $L_{LK}$ may be compensated for temperature, using a temperature sensor coupled to the transformer 120 and temperature-compensation techniques that are well-known in the art.

Once the leakage inductance $L_{LK}$ is determined, the circuit delay may be calculated from equations (1) and (2) according to:

$$\tau_{cct} = \tau_{total1} - \frac{2L_{lk}}{NV_{in}} I_{o1} \quad (7)$$

Alternatively, the total time delay $\tau_{total2}$ and load current $I_{O2}$ for the second load condition may be used to calculate the circuit delay $\tau_{cct}$, or a combination (e.g., average) of the first and second load conditions may be used.

Calculation of Time Delay Based Upon Leakage Inductance

With the leakage inductance $L_{LK}$ determined as described above, the total delay $\tau_{total}$ may be determined, at a particular time when the current is given by $I_O$, based upon:

$$\tau_{total} = \frac{2L_{lk}}{NV_{in}} I_o + \tau_{cct} \quad (6)$$

The input voltage $V_{in}$ typically has some variation, so it is preferred that the input voltage $V_{in}$ be measured (sensed) for each calculation of the total time delay $\tau_{total}$. This is shown in the voltage converter 100 of FIG. 1, where the delay estimator 166 inputs the isolated input voltage $V_{IN\_ISO}$. The controller 160 will typically convert the input voltage $V_{IN\_ISO}$ into a digital representation, for use by the delay estimator 166, using an analog-to-digital converter (ADC). (ADC not shown for ease of illustration.) Values for the leakage inductance $L_{LK}$, the turns ratio N, and the circuit delay $\tau_{cct}$ are stored in a memory (not shown for ease of illustration) of the controller 160. As described above, the leakage inductance $L_{LK}$ may be adaptively updated during normal operation of the voltage converter 100. If the input voltage $V_{in}$ is not measured, a value for $V_{in}$ that is stored within a memory of the controller 160 may be used instead.

The current $I_O$ in equation (6) corresponds to the load current $I_{LOAD}$, and is typically determined once per cycle or half cycle of the voltage converter 100. For example, the current $I_O$ may be determined by sampling the load current $I_{LOAD}$ multiple times during a cycle or half cycle of the voltage converter 100; and averaging the multiple current samples of $I_{LOAD}$ to obtain the current $I_O$ used in equation (6). Alternatively, the load current $I_{LOAD}$ may be sampled once in a cycle or half cycle of the voltage converter 100, and $I_O$ may be set to this sampled value and used in equation (6).

The total delay $\tau_{total}$ may be calculated at any point in time, but is typically calculated once per switch cycle or half cycle of the voltage converter 100. This is because the control parameters that make use of the total delay $\tau_{total}$ are typically updated once per cycle or half cycle of the voltage converter 100. In a preferred embodiment, the current $I_O$ is determined based upon a measurement of the load current $I_{LOAD}$ during a particular cycle of the voltage converter 100, and the total delay $\tau_{total}$ is calculated based upon this current $I_O$. The delay estimator 166 then provides that total delay $\tau_{total}$ to other circuitry within the controller 160, e.g., the SR switch control signal generator 162 and/or the power stage switch control signal generator 164, so that it may be used in a subsequent cycle of the voltage converter 100.

The delay estimator 166 may maintain multiple values for the leakage inductance $L_{LK}$ and may generate multiple values for the total delay $\tau_{total}$. More particularly, the secondary windings 124a, 124b may differ from each other enough that it is necessary to characterize separate leakage inductances $L_{LK}$ corresponding to each of these windings 124a, 124b. Furthermore, a magnetizing inductance (not shown for ease of illustration) of the transformer 120 may cause timing asymmetry between positive and negative half cycles of the voltage converter 100. In view of these issues, a leakage inductance $L_{LK\_POS}$ may be determined for a positive half cycle, and a separate leakage inductance $L_{LK\_POS}$ may be determined for a negative half cycle of the voltage converter. During operation of the voltage converter 100, the delay estimator 166 may generate a total delay $\tau_{total\_pos}$, based upon the leakage inductance $L_{LK\_POS}$, for use during the positive half cycle, and a separate total delay $\tau_{total\_neg}$, based upon the leakage inductance $L_{LK\_NEG}$, for use during a negative half cycle. Each of the total delay values $\tau_{total\_pos}$, $\tau_{total\_neg}$ is typically updated once during a switch cycle of the voltage converter 100.

As described above, the delay estimator 166 may dynamically calculate the total delay values $\tau_{total}$, or $\tau_{total\_pos}$ and $\tau_{total\_neg}$, based on equation (6) together with an input voltage $V_{in}$ and output current $I_O$. Alternatively, the delay estimator 166 may store the delay value(s) $\tau_{total}$, or $\tau_{total\_pos}$ and $\tau_{total\_neg}$ for all expected load and line conditions, e.g., in a table, and subsequently look up the delay value(s) based upon the input voltage $V_{in}$ and output current $I_O$.

Dead-Time Adjustments and Mode Changes

There are different operational modes that the controller 160 may use for controlling the power switches $Q_1$, $Q_2$, $Q_3$, $Q_4$ of the voltage converter 100 in order to meet the power requirements of the load 150. For example, the controller 160 may generate a square wave in which the "on" time for each cycle is fixed, and wherein the frequency is varied to match the load requirements. In another example, the controller 160 generates a pulse-width modulated (PWM) signal in which the frequency is fixed, and the duty cycle varies to match the load requirements. For such PWM control, the power switches $Q_1$ and $Q_3$ are turned on for a positive interval, all of the switches are off for a dead time interval, the power switches $Q_2$ and $Q_4$ are turned on for a negative interval, and all of the switches are turned off for a second dead time interval. The controller 160 adjusts the positive and negative intervals in which the power switches $Q_1$, $Q_2$, $Q_3$, $Q_4$ are turned on in order to meet the load requirements.

A primary disadvantage with the above control techniques is that the power switches $Q_1$, $Q_2$, $Q_3$, $Q_4$ are switched while they have fairly large voltages across them, thereby incurring significant switching losses. These switching losses may be reduced or eliminated by only switching the power switches $Q_1$, $Q_2$, $Q_3$, $Q_4$ when they have no voltage (or substantially no voltage) across them. Such zero voltage switching (ZVS) increases the efficiency of the voltage converter 100. One well-known technique for achieving such ZVS is by use of phase-shifted modulation (PSM).

Figure 3:
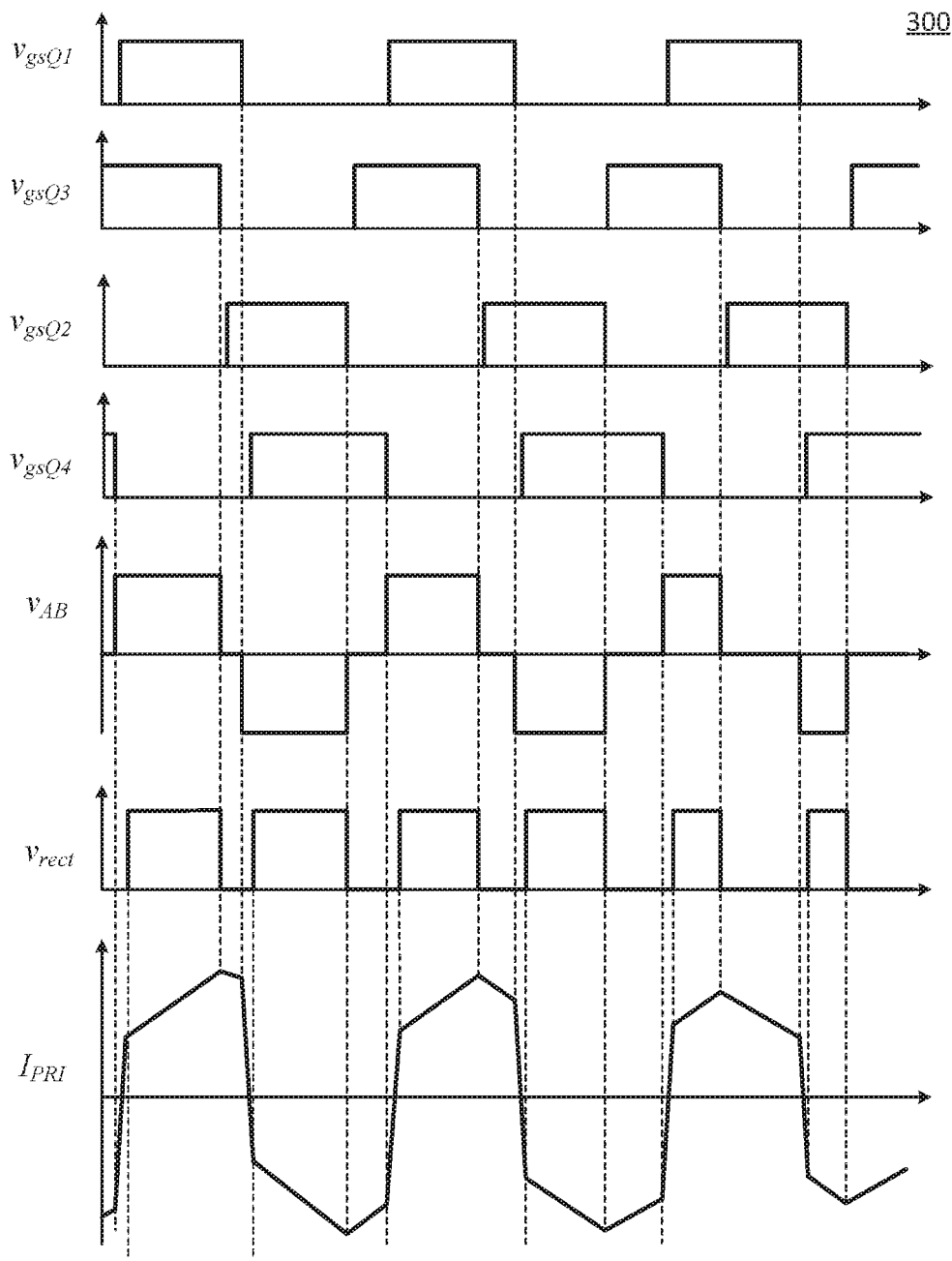
FIG. 3 illustrates waveforms corresponding to the voltage, current, and control signals within the voltage converter of FIG. 1, when it is operated using phase-shifted modulation.

FIG. 3 illustrates waveforms 300 corresponding to PSM control of the full-bridge voltage converter 100. Note that control signals $V_{gsQ1}$, $V_{gsQ4}$ for the power switches $Q_1$ and $Q_4$ are complementary to each other, except for a brief dead-time that ensures that $Q_1$ and $Q_4$ are not simultaneously enabled. (As evident in the voltage converter 100 of FIG. 1, simultaneous enabling of $Q_1$ and $Q_4$ would lead to a low-impedance short between $V_{in}$ and ground, and likely catastrophic failure of the power switches $Q_1$ and $Q_4$.) Similarly, the control signals $V_{gsQ2}$, $V_{gsQ3}$ for the power switches $Q_2$ and $Q_3$ are complementary to each other, except for a brief dead-time that ensures that $Q_2$ and $Q_3$ are not simultaneously enabled.

When controlling the voltage converter 100 of FIG. 1 using PSM, the energy of the leakage inductance $L_{LK}$ is responsible for providing the soft-switching transitions, as illustrated in the idealized waveforms 300 of FIG. 3. To achieve such soft-switching, the controller must set the timing, including the dead-time, appropriately to achieve ZVS. In conventional operation, this involves setting a large dead-time in order to accommodate the full range of delay through the voltage converter 100, including the delay caused by the leakage inductance $L_{LK}$, wherein the delay varies across load and line conditions. Such a large fixed delay time will be optimal at only one operating point, e.g., under a moderately-light load condition of the voltage converter 100. Under other conditions, e.g., under full load, the large delay time is unnecessary to achieve ZVS. In fact, the excessive dead-time under such conditions causes unnecessary conduction loss through the body diode of a power switch (e.g., $Q_1$, $Q_2$, $Q_3$, $Q_4$) within the voltage converter 100. To maximize the efficiency of the voltage converter 100, the dead-time must be determined such that it is just large enough to achieve ZVS, and, thereby, not so large as to result in conduction loss through the body diodes of the power switches. With the delay time $\tau_{total}$ through the transformer 120 determined as described above, the dead time may be optimally determined thusly.

While the above description focussed on PSM operation within a full-bridge voltage converter, the optimization of dead time using the techniques herein are also applicable to (non-phase shifted) PWM control of a full-bridge or half-bridge voltage converter. However, full-bridge converters that use PSM control are typically designed to have relatively large leakage inductances $L_{LK}$, as PSM control relies upon the leakage inductance to provide adequate energy for charging/discharging the output capacitances of the power switches $Q_1$, $Q_2$, $Q_3$, $Q_4$ in order to achieve ZVS. A leakage inductance that is too small is incapable of storing adequate energy for such charging/discharging and the associated ZVS. The large leakage inductances found in PSM-controlled voltage converters lead to significant load-dependent delays through such voltage converters. Hence, the techniques described above for determining load-dependent delays are particularly beneficial to PSM-controlled voltage converters.

The PSM control of the full bridge voltage converter 100 inherently loses ZVS as the load of the voltage converter 100 reduces, as is understood in the art. Once ZVS is lost, other operational modes, e.g., non-phase-shifted PWM, become more efficient than PSM. It is known in the art to switch from PSM to PWM as the load of a voltage converter reduces. By using the delay time $\tau_{total}$, including its load-dependent component, as determined using the techniques above, the line and/or load condition at which ZVS is lost using PSM may be more accurately determined. The controller 160 may switch control modes, e.g., from PSM to PWM, at this point in order to achieve more efficient operation.

SR Switch Time Optimization

Figure 4A:
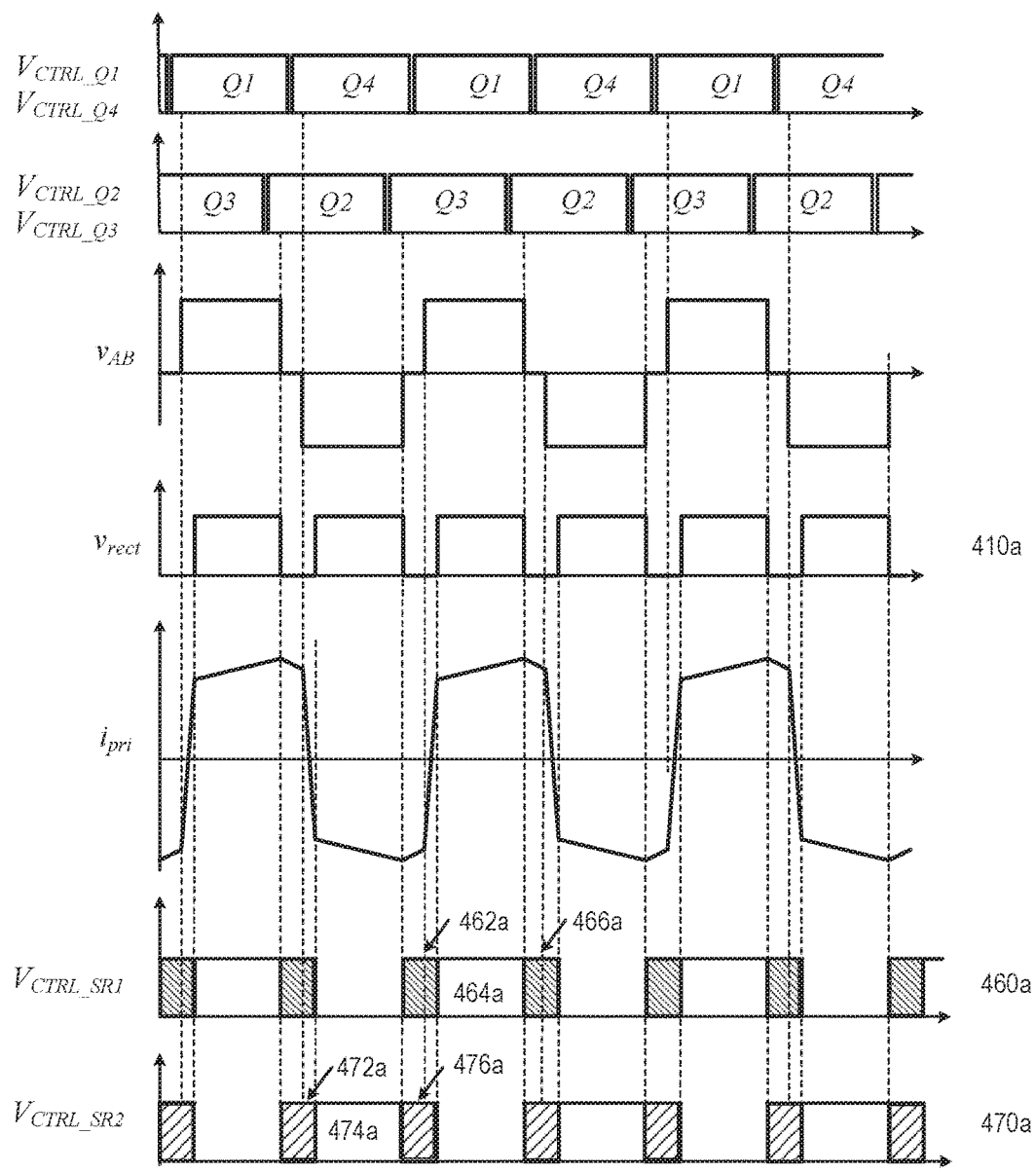
FIGS. 4a and 4b illustrates voltage waveforms corresponding to the control of primary-side control switches and secondary-side rectification switches within the voltage converter of FIG. 1, when it is operated using phase-shifted modulation.
Figure 4B:
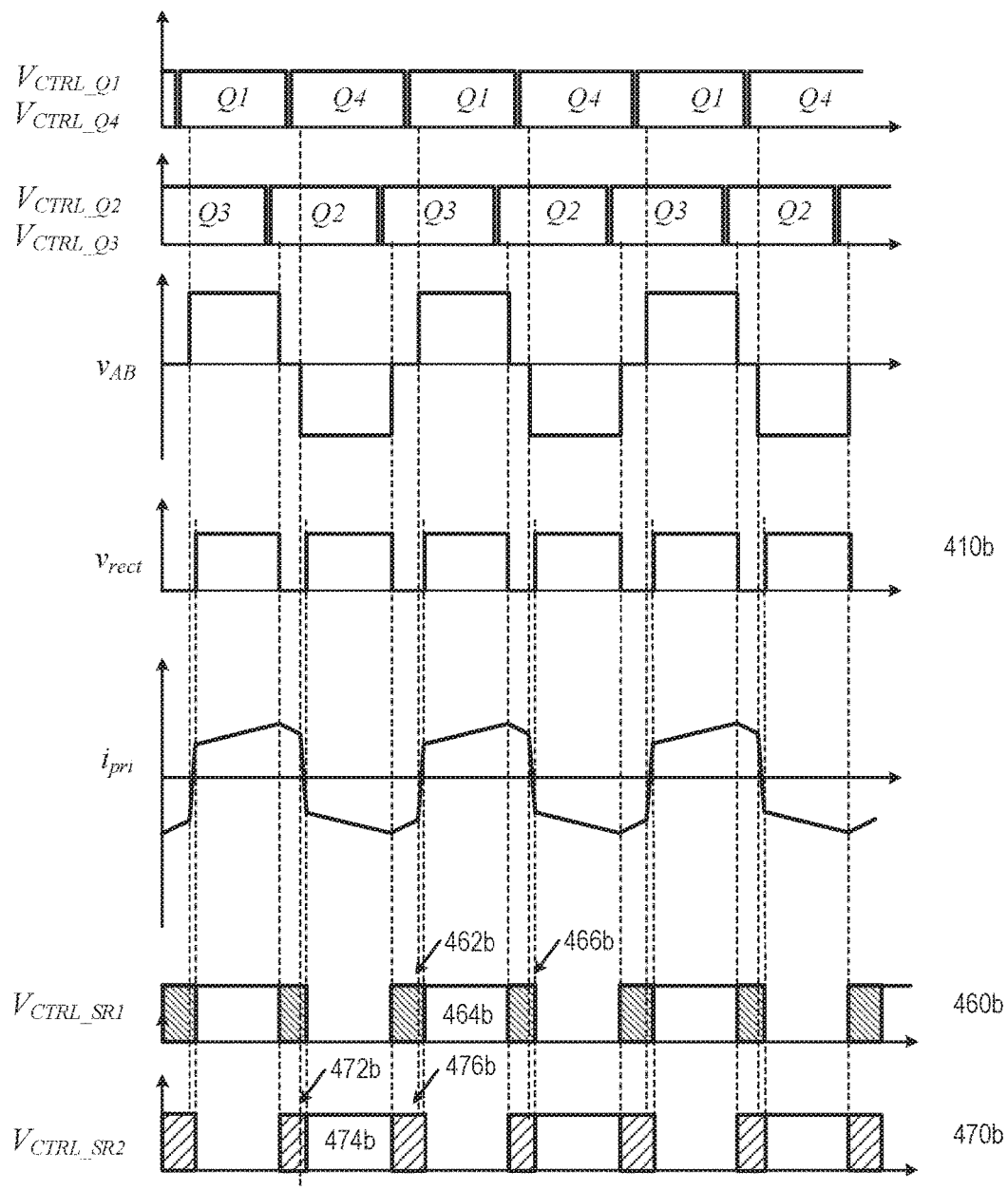

For voltage converters that use SR switches for rectification, the timing of the signals used for controlling these SR switches may make use of the delay times described above. This will be described using FIGS. 4a and 4b, which illustrate waveforms 400a, 400b corresponding to signals and voltages within the voltage converter 100 of FIG. 1, when the controller 160 is using PSM to control the power switches $Q_1$, $Q_2$ $Q_3$ $Q_4$. These waveforms 400a, 400b are similar to those of FIG. 3, and the similar aspects will not be described below. However, the waveforms 400a, 400b additionally illustrate waveforms 460a, 460b, 470a, 470b corresponding to the SR switch control signals $V_{CTRL\_SR1}$, $V_{CTRL\_SR2}$. Whereas the waveforms 300 of FIG. 3 illustrate a reducing load condition, FIGS. 4a and 4b illustrate, respectively, waveforms 400a corresponding to a full-load condition of the voltage converter 100, and waveforms 400b corresponding to a half-load condition of the voltage converter 100.

Using a rather conservative conventional technique, the SR switches $SR_1$, $SR_2$ are turned on only for the time periods 464a, 474a shown for the full-load condition, or the time periods 464b, 474b shown for the half-load condition, for each pulse of the waveforms 460a, 470a, 460b, 470b. These periods correspond to the interval during which there is non-zero voltage $V_{AB}$ across the input to the transformer 120. For all other time periods, including the hatched areas 462a, 466a, 462b, 466b, the switch $SR_1$ would be turned off. Likewise for all other time periods, including the hatched areas 472a, 476a, 472b, 476b, the switch $SR_2$ would be turned off. This leads to inefficiencies due to conduction loss through the body diodes of the SR switches $SR_1$, $SR_2$. More efficient operation of the voltage converter 100 may be realized if the SR switches $SR_1$, $SR_2$ can be kept on longer.

For the full-load condition, the cross-hatched regions 462a, 466a, represent time periods when switch $SR_1$ could be kept on, whereas the regions 472a, 476a represent time periods when the switch $SR_2$ could be kept on. In a more efficient technique, a fixed time delay corresponding to the half-load condition could be presumed, and the timing of the SR switch signals $V_{CTRL\_SR1}$, $V_{CTRL\_SR1}$, would be set accordingly. However, such operation is only optimal for one particular load/line condition.

In the preferred embodiment, SR switch $SR_1$, is turned on for the entire period 462a, 464a, 466a for the full-load condition, and during the entire period 462b, 464b, 466b for the half-load condition. Similarly, SR switch $SR_2$ is turned on for the entire period 472a, 474a, 476a for the full-load condition, and during the entire period 472b, 474b, 476b for the half-load condition. Note that these time periods are different for the two load conditions, due to the load-dependent delay through the voltage converter 100. Hence, the load-dependent delay must be estimated, e.g., from a determined leakage inductance $L_{LK}$, in order to vary the SR switch timing according to the load conditions.

SR switch control for a voltage converter operating in PWM mode is largely the same as that described above for PSM mode, with the noteworthy exception that the leakage inductance $L_{LK}$ is often considerably larger for voltage converters employing PSM. This means that the load-dependent component of the delay will be considerably larger for PSM-mode voltage converters, and the corresponding timing adjustments for the SR switches lead to more significant efficiency improvements for PSM-mode voltage converters, as compared to non-phase-shifted PWM mode voltage converters.

Flux Estimation and Balancing

In order to prevent saturation of the core for the transformer 120, transformer flux must be balanced between positive and negative flux excursions. Techniques for estimating and balancing transformer flux are disclosed in U.S. patent application Ser. No. 15/235,872, filed Aug. 12, 2016. For a transformer having a center-tapped secondary winding, many such techniques presume the coupling for each of the secondary windings is exactly equal. In practice, such coupling is not identical which may lead to poor flux balancing. For example, flux estimation techniques that make use of primary side voltages, e.g., $V_{AB}$ in the voltage converter 100, to estimate transformer flux will not detect mismatches in positive and negative flux excursions that are caused by unequal coupling of the secondary windings 124a, 124b. By maintaining separate estimates of the leakage inductances $L_{LK}$ corresponding to each of the secondary windings 124a, 124b, duty cycles for the control signals $V_{CTRL\_Q1}$, $V_{CTRL\_Q2}$, $V_{CTRL\_Q3}$, $V_{CTRL\_Q4}$, may be adjusted such that the length of generated positive and negative pulses at $V_{AB}$ are not identical. The adjustments may be made to compensate for differences in the time delays (primarily the load-dependent $\tau_{Llk}$ component) incurred through each of the secondary windings 124a, 124b. Each of these time delays may be determined based on the techniques described above including, e.g., the calculation in equation (6). The effect of these adjustments is that the voltage pulses on $V_{rect}$ corresponding to positive and negative half cycles should be nearly perfectly balanced. For a PSM-controlled voltage converter, this corresponds to having the same duty cycle loss for the positive and negative half cycles.

Some techniques for estimating and balancing transformer flux use measurements of the rectified voltage $V_{rect}$ to generate a volt-second flux estimate. (See U.S. patent application Ser. No. 15/235,872, filed Aug. 12, 2016.) For a given half cycle of the voltage converter 100, a voltage pulse on $V_{rect}$ may need to be characterized. For example, the average voltage throughout the voltage pulse may be determined by sampling $V_{rect}$ while this pulse is high. A disadvantage of this technique is that it requires excessive sampling of the rectified voltage $V_{rect}$. This disadvantage may be overcome by only sampling $V_{rect}$ at a mid-point of the voltage pulse, and using such a sampled value to characterize the voltage pulse. By using the techniques described above, the load-dependent delay may be used to accurately calculate the leading and falling edges of a voltage pulse on $V_{rect}$, and a corresponding mid-on point of the voltage pulse, without such sampling.

Choosing Sample Points for Control

A controller, such as the controller 160 of voltage converter 100, adjusts the control signals provided to the power stage 110 in order to ensure adequate power is provided to the load 150. This control typically requires measuring (sensing) the output voltage $V_O$ and/or current $I_O$. The control signals are typically updated once per cycle of the voltage converter 100 and, thus, values for the control input signals, e.g., $V_O$ and/or current $I_O$, must be updated for each cycle. In many applications, it is preferred to limit the sampling of these input signals, and the associated power consumption. This may be accomplished by sampling these signals at strategic time instances within a cycle, e.g., the mid-on and mid-off times for pulses on the rectified voltage $V_{rect}$. The above-described techniques for determining load-dependent delays through the transformer 120 may be used to more accurately determine such a mid-on or mid-off point. For example, the controller 160 may use the timing of its switch control signals $V_{CTRL\_Q1}$, $V_{CTRL\_Q2}$, $V_{CTRL\_Q3}$, $V_{CTRL\_Q4}$ together with one or more load-dependent delays $\tau_{Llk}$ to accurately predict the start and stop of a voltage pulse on the rectified voltage $V_{rect}$, and corresponding mid-on and mid-off points.

Methods for Determining Leakage Inductance and Associated Delays

Figure 5:
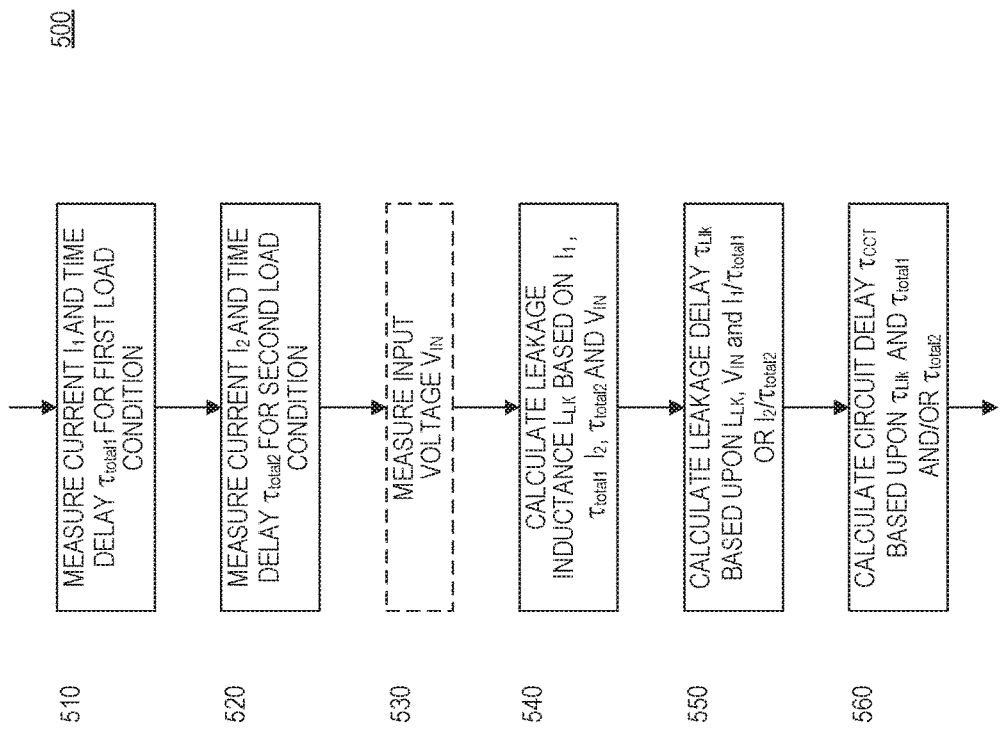
FIG. 5 shows a method for determining a leakage inductance and a corresponding load-dependent delay through a voltage converter such as that illustrated in FIG. 1.

FIG. 5 illustrates a method 500 for determining a load-dependent delay within a voltage converter. This method may be implemented, e.g., within a voltage converter such as that illustrated in FIG. 1. More particularly, the method may be implemented within a controller, such as the controller 160, of such a voltage converter. The techniques of this method 500 are similar to those described above regarding the voltage converter 100 of FIG. 1 and its variants, and the described method 500 may be augmented with other techniques described for the voltage converter 100.

In a first step 510, an output current $I_1$ is measured (sensed) and a first time delay $\tau_{total1}$ is measured for a first load condition of a voltage converter. In a second step 520, an output current $I_2$ is measured (sensed) and a second time delay $\tau_{total2}$ is measured for a second load condition. In an optional step 530, an input voltage $V_{in}$ of the voltage converter is measured (sensed). (If this step 530 is not performed, a fixed value for $V_{in}$ may be presumed.) A leakage inductance $L_{LK}$ is calculated 540 based upon the first output current current $I_1$, the second output current $I_2$, the first time delay $\tau_{total1}$, the second time delay $\tau_{total2}$, the input voltage $V_{in}$, a transformer turns ratio N and optional compensation constants. In a preferred embodiment, equation (5) is used to determine the leakage inductance $L_{LK}$. Once the leakage inductance is determined, the load-dependent component delay $\tau_{Llk}$ may be calculated, e.g., using equation (2), for the first and/or second load conditions. The load-independent component $\tau_{CCT}$ of the delay may then be calculated 560, e.g., using equation (1), from the load-dependent component delay $\tau_{Llk}$ together with the total delay $\tau_{total1}$, $\tau_{total2}$, for the first and/or second load conditions. In a preferred embodiment, a load-independent delay component $\tau_{CCT}$ is calculated using the load-dependent component delay $\tau_{Llk}$ and the total delay $\tau_{total1}$, $\tau_{total2}$ for each of the two load conditions. The two calculated versions of $\tau_{CCT}$, which should be similar, are then averaged to determine a final load-independent delay $\tau_{CCT}$.

As explained regarding the voltage converter 100, the techniques above may be performed during a calibration/characterization phase, may be performed during normal operation of the voltage converter, or both.

Figure 6:
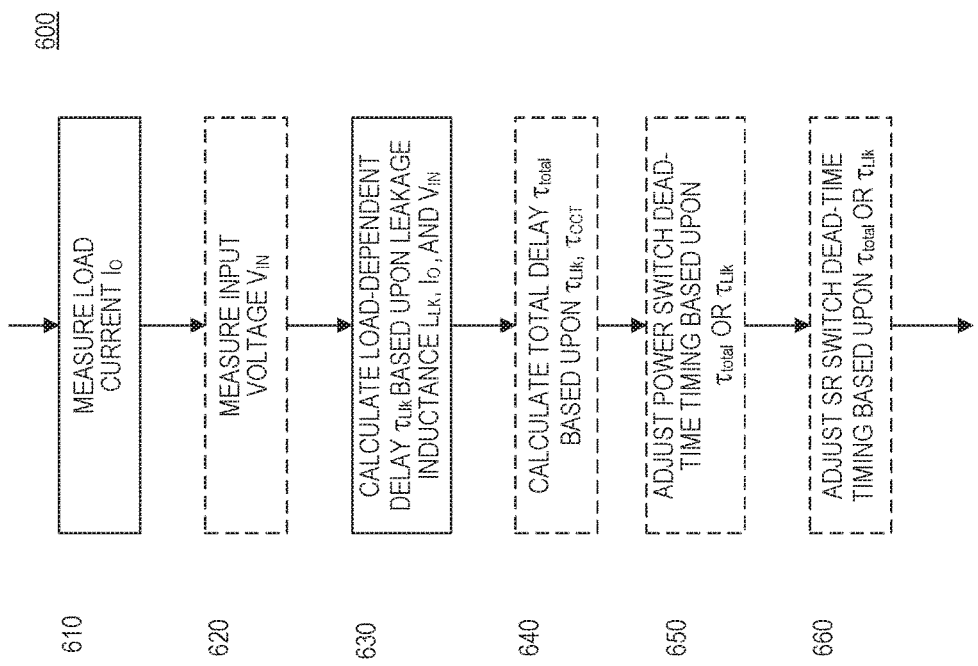
FIG. 6 shows a method for determining a load-dependent delay based upon a leakage inductance.

FIG. 6 illustrates a method 600 for determining delays through a voltage converter after the leakage inductance $L_{LK}$ and load-independent delay $\tau_{CCT}$ have been determined. This method may be implemented, e.g., within a voltage converter such as that illustrated in FIG. 1, and includes techniques similar to those described above regarding the voltage converter 100. The method begins by measuring (sensing) 610 a load current $I_o$, and (optionally) measuring (sensing) 620 an input voltage $V_{in}$ of a voltage converter. (If this step 620 is not performed, a fixed value for $V_{in}$ may be presumed.) A load-dependent delay $\tau_{Llk}$ through the voltage converter is then calculated 630, e.g., using equation (2), based upon the leakage inductance $L_{LK}$, the output load current $I_o$, and the input voltage $V_{in}$. The total delay $\tau_{total}$ may then (optionally) be calculated 640, e.g., using equation (1), from the load-dependent delay $\tau_{Llk}$ and the load-independent delay $\tau_{CCT}$. In an optional step 650, the total delay $\tau_{total}$, or only its load-dependent component $\tau_{Llk}$, is then used to adjust the timing of control signals used for controlling power switches, e.g., switches $Q_1$, $Q_2$, $Q_3$, $Q_4$ in FIG. 1, within a power stage of the voltage converter. In another optional step 660, the total delay $\tau_{total}$, or only its load-dependent component $\tau_{Llk}$, is used to adjust the timing of control signals used for controlling rectification switches, e.g., switches $SR_1$, $SR_2$ in FIG. 1, on the secondary side of a voltage converter. In still other embodiments (not illustrated in FIG. 6), the total delay $\tau_{total}$ or its load-dependent component delay $\tau_{Llk}$ may be used to determine a mid-on or mid-off sampling point for sampling the output current or rectified voltage of a voltage converter. Values obtained from sampling the output current or rectified voltage of the voltage converter at the mid-on or mid-off point may then be used by a controller, such as the controller 160, in its control of a power stage to ensure adequate power is being delivered to a load of the voltage converter. Such mid-on/mid-off sampling may also be used to obtain voltages used by a controller, such as the controller 160, when implementing flux balancing.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A voltage converter, comprising:
 a power stage including two or more power switches; and
 a controller configured to:
  determine, for a first load condition, a first output current of the voltage converter and a corresponding first time delay through the voltage converter;
  determine, for a second load condition, a second output current of the voltage converter and a corresponding second time delay through the voltage converter; and
  determine a load-dependent delay of the voltage converter based upon the first output current, the first time delay, the second output current, and the second time delay.

2. The voltage converter of claim 1, further comprising a transformer electrically coupled to the power stage, wherein a leakage inductance associated with the transformer is a component of the load-dependent delay, and wherein the controller is further configured to:
 estimate the leakage inductance based upon an input voltage of the voltage converter, a turns ratio of the transformer and the load-dependent delay.

3. The voltage converter of claim 2, wherein the transformer comprises a center-tapped secondary winding, and a load-dependent delay is determined for each of a first part of the center-tapped secondary winding and a second part of the center-tapped secondary winding.

4. The voltage converter of claim 2, wherein the controller is configured to estimate the leakage inductance $L_{lk}$ using:

$$L_{lk} = \frac{\Delta \tau N V_{in} k}{2(I_{o1} - I_{o2})} + LK_{off}$$

wherein $\Delta \tau$ is the difference between the first and second delays and corresponds to the load-dependent delay, $I_{o1}$ and $I_{o2}$ are the first and second output currents,
N is the turns ratio of the transformer,
$V_{in}$ is the input voltage of the voltage converter,
k is a gain compensation term, and
$LK_{off}$ is an offset compensation term.

5. The voltage converter of claim 1, wherein the determination of the first time delay comprises measuring a plurality of time delays for the first load condition and averaging the plurality of time delays.

6. The voltage converter of claim 1, further comprising:
 a transformer separating a primary side and a secondary side of the voltage converter, the primary side comprising the power stage,
 wherein the controller is configured to determine the first time delay by:
  generating a control signal to turn on a power switch of the power stage at a first time instant;
  sensing, at a node within the secondary side of the voltage converter, a response corresponding to the generated control signal, at a second time instant; and
  determining the first time delay based upon a difference between the first time instant and the second time instant.

7. The voltage converter of claim 1, wherein the two or more power switches comprise a high-side power switch and a low-side power switch on a primary side of the voltage converter, and wherein the controller is further configured to:
 determine a dead time, during which the high-side and low-side power switches are off at the same time, based upon the load-dependent delay and a present load condition.

8. The voltage converter of claim 1, further comprising:
 a synchronous rectification (SR) switch on a secondary side of the voltage converter,
 and wherein the controller is further configured to:
  generate a control signal for the SR switch based upon the load-dependent delay and a present load condition.

9. The voltage converter of claim 1, wherein the controller is further configured to:
 determine a midpoint of an on period, an off period, or both, for a rectified voltage waveform on a secondary side of the voltage converter, based upon the load-dependent delay and a present load condition;
 sample the output current at the midpoint;
 determine a control parameter comprising at least one of a duty cycle, phase shift, or frequency based upon the sampled output current; and
 generate control signals for the one or more power switches based upon the control parameter.

10. The voltage converter of claim 1, wherein the controller if further configured to:
 change from a first control mode to a second control mode of the voltage converter based upon a load condition and the load-dependent delay, wherein the first control mode and the second control mode are taken from phase-shifted modulation, pulse-width modulation, and frequency modulation.

11. The voltage converter of claim 1, wherein the controller is further configured to:
 determine a midpoint of a positive interval during a first half cycle of a switching cycle, a negative interval during a second half cycle of the switching cycle, or both, based upon the load-dependent delay and a present load condition;

sample a rectified voltage waveform on a secondary side of the voltage converter using at least one of said midpoints; and estimate a magnetic flux of a transformer of the voltage converter based upon the sampled rectified voltage waveform.

12. A method within a voltage converter, the method comprising:

determining, for a first load condition, a first output current of the voltage converter and a corresponding first time delay through the voltage converter;

determining, for a second load condition, a second output current of the voltage converter and a corresponding second time delay through the voltage converter; and determining a load-dependent delay of the voltage converter based upon the first output current, the first time delay, the second output current, and the second time delay.

13. The method of claim 12, wherein the voltage converter comprises a transformer electrically coupled to a power stage, wherein a leakage inductance associated with the transformer is a component of the load-dependent delay, the method further comprising:

estimating the leakage inductance based upon an input voltage of the voltage converter, a turns ratio of the transformer and the load-dependent delay.

14. The method of claim 13, wherein the transformer comprises a center-tapped secondary winding, and a load-dependent delay is determined for each of a first part of the center-tapped secondary winding and a second part of the center-tapped secondary winding.

15. The method of claim 13, wherein the leakage inductance $L_{lk}$ is estimated using:

$$L_{lk} = \frac{\Delta \tau N V_{in} k}{2(I_{o1} - I_{o2})} + LK_{off}$$

wherein $\Delta \tau$ is the difference between the first and second delays and corresponds to the load-dependent delay, $I_{o1}$ and $I_{o2}$ are the first and second output currents, N is the turns ratio of the transformer, $V_{in}$ is the input voltage of the voltage converter, k is a gain compensation term, and $LK_{off}$ is an offset compensation term.

16. The method of claim 12, wherein determining the first time delay comprises measuring a plurality of time delays for the first load condition and averaging the plurality of time delays.

17. The method of claim 12, wherein the voltage converter comprises a primary side and a secondary side that are separated by a transformer, the primary side comprising a power stage, and wherein determining the first time delay comprises:

generating a control signal to turn on a power switch of the power stage at a first time instant;

sensing, at a node within the secondary side of the voltage converter, a response corresponding to the generated control signal, at a second time instant; and determining the first time delay based upon a difference between the first time instant and the second time instant.

18. The method of claim 12, wherein the voltage converter comprises a high-side power switch and a low-side power switch on a primary side of the voltage converter, the method further comprising:

determining a dead time, during which the high-side and low-side power switches are off at the same time, based upon the load-dependent delay and a present load condition.

19. The method of claim 12, further comprising:

generating a control signal for a synchronous rectification switch, on a secondary side of the voltage converter, based upon the load-dependent delay and a present load condition.

20. The method of claim 12, further comprising:

determining a midpoint of an on period, an off period, or both, for a rectified voltage waveform on a secondary side of the voltage converter, based upon the load-dependent delay and a present load condition;

sampling the output current at the midpoint;

determining a control parameter comprising at least one of a duty cycle, phase shift, or frequency based upon the sampled output current; and generating control signals for one or more power switches based upon the control parameter.

21. The method of claim 12, further comprising:

changing from a first control mode to a second control mode of the voltage converter based upon a load condition and the load-dependent delay, wherein the first control mode and the second control mode are taken from phase-shifted modulation, pulse-width modulation, and frequency modulation.

22. The method of claim 12, further comprising:

determining a midpoint of a positive interval during a first half cycle of a switching cycle, a negative interval during a second half cycle of the switching cycle, or both, based upon the load-dependent delay and a present load condition;

sampling a rectified voltage waveform on a secondary side of the voltage converter using at least one of said midpoints; and estimating a magnetic flux of a transformer of the voltage converter based upon the sampled rectified voltage waveform.

* * * * *